*12* United States Patent  
Suzuki et al.

(10) Patent No.: US 8,926,859 B2  
(45) Date of Patent: Jan. 6, 2015

(54) POLISHING COMPOSITION FOR SILICON WAFERS

(75) Inventors: Masahiko Suzuki, Wakayama (JP); Mami Okamura, Wakayama (JP); Toshiaki Oi, Wakayama (JP)

(73) Assignee: Kao Corporation, Tokyo (JP)

( * ) Notice: Subject to any disclaimer, the term of this patent is extended or adjusted under 35 U.S.C. 154(b) by 236 days.

(21) Appl. No.: 13/382,839

(22) PCT Filed: Jul. 5, 2010

(86) PCT No.: PCT/JP2010/061411
§ 371 (c)(1),
(2), (4) Date: Jan. 6, 2012

(87) PCT Pub. No.: WO2011/004793
PCT Pub. Date: Jan. 13, 2011

(65) Prior Publication Data
US 2012/0108064 A1 May 3, 2012

(30) Foreign Application Priority Data

Jul. 7, 2009 (JP) ............................... 2009-160943
Nov. 27, 2009 (JP) ............................... 2009-270471
Apr. 28, 2010 (JP) ............................... 2010-104079

(51) Int. Cl.
*C09K 13/00* (2006.01)
*H01L 21/302* (2006.01)
*H01L 21/461* (2006.01)
*C03C 15/00* (2006.01)
*C03C 25/68* (2006.01)
*H01L 21/02* (2006.01)
*B24B 37/04* (2012.01)
*C09G 1/02* (2006.01)

(52) U.S. Cl.
CPC ........ *H01L 21/02024* (2013.01); *B24B 37/044* (2013.01); *C09G 1/02* (2013.01)
USPC .......... 252/79.1; 438/689; 438/690; 438/691; 438/692; 438/693; 216/88; 216/89; 216/90; 216/91

(58) Field of Classification Search
CPC .... B81C 2201/0104; B24B 1/00; C09G 1/00; C09G 1/02; C09K 3/1463; C09K 3/1409; H01L 21/7684; H01L 21/3212
USPC ............................... 216/88–91; 438/690–693
See application file for complete search history.

(56) References Cited

U.S. PATENT DOCUMENTS

| 5,662,997 A * | 9/1997 | Onishi et al. ................. 428/331 |
| 2004/0123527 A1 * | 7/2004 | Kitayama et al. ............... 51/307 |
| 2006/0090402 A1 | 5/2006 | Uemura |
| 2006/0118760 A1 | 6/2006 | Yang et al. |
| 2006/0135045 A1 | 6/2006 | Bian et al. |
| 2006/0154004 A1 * | 7/2006 | Hayashi et al. ............ 428/32.34 |
| 2007/0181851 A1 | 8/2007 | Yamada |
| 2007/0237701 A1 | 10/2007 | Yamakawa et al. |
| 2008/0051010 A1 | 2/2008 | Uemura |
| 2008/0192103 A1 * | 8/2008 | Daems et al. ................. 347/102 |
| 2008/0261856 A1 * | 10/2008 | Nakagawa et al. ........... 510/421 |

FOREIGN PATENT DOCUMENTS

| FR | 2879617 A1 | 6/2006 |
| JP | 6-254383 A | 9/1994 |
| JP | 11-060232 A | 3/1999 |
| JP | 11-116942 A | 4/1999 |
| JP | 11-214338 A | 8/1999 |
| JP | 2004-204116 A | 7/2004 |
| JP | 2005-060217 A | 3/2005 |
| JP | 2005-060219 A | 3/2005 |
| JP | 2005-097445 A | 4/2005 |
| JP | 2005-353681 A | 12/2005 |
| JP | 2006-128518 A | 5/2006 |
| JP | 2007-019093 A | 1/2007 |
| JP | 2007-214205 A | 8/2007 |
| JP | 2008-053415 A | 3/2008 |
| JP | 2008-235491 A | 10/2008 |
| JP | 2009-094233 A | 4/2009 |

OTHER PUBLICATIONS

International Search Report, PCT/JP2010/061411, Sep. 21, 2010.
The Communication and Extended European Search Report, dated Sep. 10, 2014, issued in the corresponding European Patent Application No. 10797104.6.

* cited by examiner

*Primary Examiner* — Allan Olsen
*Assistant Examiner* — Margaret D Klunk
(74) *Attorney, Agent, or Firm* — Birch, Stewart, Kolasch & Birch, LLP

(57) ABSTRACT

A polishing composition for a silicon wafer includes a macromolecular compound, an abrasive, and an aqueous medium. The macromolecular compound includes a constitutional unit (a1) represented by the following general formula (1), a constitutional unit (a2) represented by the following general formula (2), and a constitutional unit (a3) represented by the following general formula (3). The total of the constitutional unit (a3) is 0.001 to 1.5 mol % of all the constitutional units of the macromolecular compound.

[Chemical Formula 1]

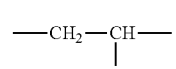

(1)

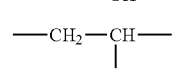

(2)

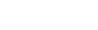

(3)

8 Claims, No Drawings

POLISHING COMPOSITION FOR SILICON WAFERS

TECHNICAL FIELD

The present invention relates to a polishing composition for a silicon wafer, a method for manufacturing a semiconductor substrate using the polishing composition, and a method for polishing a silicon wafer with the polishing composition.

BACKGROUND ART

A polishing composition including silica particles has been known as a polishing composition used to polish a silicon wafer that is used in the manufacture of a semiconductor substrate. In this type of polishing composition, there are problems such that the surface defects (LPD: light point defects) of a silicon wafer occur due to the agglomeration of the silica particles, and when the polishing composition is filtered to remove an agglomerate, the filter is clogged (see, e.g., Patent Document 1 and Patent Document 2). Moreover, in order to improve the polishing rate, a polishing composition that includes a water-soluble macromolecular compound including a nitrogen-containing group has been known (see Patent Document 3).

PRIOR ART DOCUMENTS

Patent Documents

Patent Document 1: JP 2006-128518 A
Patent Document 2: JP 2008-53415 A
Patent Document 3: JP 2007-19093 A
Patent Document 4: JP 11(1999)-116942 A

DISCLOSURE OF INVENTION

Problem to be Solved by the Invention

Patent Document 1 is intended to prevent clogging of a filter and proposes a polishing composition including colloidal silica, potassium hydroxide, and potassium bicarbonate. However, since the polishing composition includes a sodium ion and a potassium ion, abrasive grains are likely to adhere to the surface of a silicon wafer. As a result of this, the surface defects of the silicon wafer may occur easily.

Patent Document 2 is intended to reduce the LPD and proposes a polishing composition including at least one type of water-soluble polymer selected from polyvinylpyrrolidone and poly(N-vinylformamide), and an alkali. However, polishing with this polishing composition cannot achieve a satisfactory polishing rate.

Patent Document 3 proposes a polishing composition including a water-soluble macromolecular compound including a nitrogen-containing group such as polyethyleneimine. However, when this polishing composition is used, silica particles are agglomerated by the water-soluble macromolecular compound including the nitrogen-containing group, resulting in the degradation of the surface state of a silicon wafer (e.g., the generation of scratches).

Patent Document 4 is intended to improve the polishing rate and the wettability of the surface of an object to be polished and proposes a polishing composition including hydroxyethyl cellulose (HEC). However, the use of the HEC tends to form an agglomerate of silica particles, and even if the polishing composition is filtered, the filter is clogged at once. Therefore, the polishing composition cannot be filtered immediately before polishing.

Moreover, the polishing composition is generally stored and transported in the form of a concentrated liquid. Thus, the storage stability of the concentrated liquid of the polishing composition is also required.

The present invention provides a polishing composition for a silicon wafer that not only can achieve high-speed polishing of a silicon wafer and ensure good storage stability of the concentrated liquid and good wettability of the surface of the silicon wafer, but also can reduce clogging of a filter, a method for manufacturing a semiconductor substrate using the polishing composition, and a method for polishing a silicon wafer with the polishing composition.

Means for Solving Problem

A polishing composition for a silicon wafer of the present invention includes a macromolecular compound, an abrasive, and an aqueous medium. The macromolecular compound includes a constitutional unit (a1) represented by the following general formula (1), a constitutional unit (a2) represented by the following general formula (2), and a constitutional unit (a3) represented by the following general formula (3). The total of the constitutional unit (a3) is 0.001 to 1.5 mol % of the constitutional units of the macromolecular compound.

[Chemical Formula 1]

(where R is a $C_1$ to $C_3$ alkyl group, and X is a constitutional unit that has a cation group in a molecule and is derived from an unsaturated compound copolymerizable with a vinyl alcohol lower fatty acid ester)

A method for manufacturing a semiconductor substrate of the present invention includes polishing a silicon wafer with the polishing composition for a silicon wafer of the present invention.

A method for polishing a silicon wafer of the present invention includes polishing a silicon wafer with the polishing composition for a silicon wafer of the present invention.

Effects of the Invention

The present invention can provide a polishing composition for a silicon wafer that not only can achieve high-speed polishing of a silicon wafer and ensure good storage stability of the concentrated liquid and good wettability of the silicon wafer, but also can reduce clogging of a filter, a method for manufacturing a semiconductor substrate using the polishing composition, and a method for polishing a silicon wafer with the polishing composition.

DESCRIPTION OF THE INVENTION

The present invention is based on the findings that when the polishing composition includes the macromolecular compound including a constitutional unit (a1) represented by the following general formula (1), a constitutional unit (a2) represented by the following general formula (2), and a constitutional unit (a3) represented by the following general formula (3), in which the total of the constitutional unit (a3) is 0.001 to 1.5 mol % of the constitutional units of the macromolecular compound (such a macromolecular compound may also be abbreviated as "a macromolecular compound having a cation group" in the following), both the storage stability of the concentrated liquid and the wettability of the silicon wafer are good, clogging of a filter can be reduced when the polishing composition passes through the filter to remove an agglomerate or the like of the abrasive immediately before polishing, and the surface of the silicon wafer can be polished at a high polishing rate.

In general, the surface of the silicon wafer and the surface of the abrasive such as silica are negatively charged in the presence of an alkali Therefore, it is estimated that the macromolecular compound having the cation group used in the present invention is properly adsorbed on the surface of the silicon wafer and imparts good wettability thereto. Moreover, it is estimated that the macromolecular compound having the cation group used in the present invention is also adsorbed on the surface of the abrasive and allows the abrasive to be properly aggregated, and that the aggregation of the abrasive combined with good wettability of the surface of the silicon wafer enables high-speed polishing of the silicon wafer.

(Macromolecular Compound Having Cation Group)

The macromolecular compound having the cation group included in the polishing composition for a silicon wafer of the present invention (which may be abbreviated as "a polishing composition" in the following) includes constitutional units (a1) to (a3) represented by the following general formulae (1) to (3), respectively.

[Chemical Formula 2]

$$—CH_2—CH— \atop |\ \ \ \ \ \ \ \ OH \quad (1)$$

$$—CH_2—CH— \atop |\ \ \ \ \ \ \ \ OCOR \quad (2)$$

$$—X— \quad (3)$$

In the above formulae, R is a $C_1$ to $C_3$ alkyl group and X is a constitutional unit that has a cation group in a molecule and is derived from an unsaturated compound copolymerizable with a vinyl alcohol lower fatty acid ester.

The macromolecular compound having the cation group including the constitutional units (a1), (a2), and (a3) can be obtained by copolymerizing a monomer compound serving as a supply source of the constitutional unit (a2) and a monomer compound serving as a supply source of the constitutional unit (a3), and partially saponifying the copolymer thus formed. For example, when R of the general formula (2) is a methyl group, the copolymer of a polymerizable cationic monomer (i.e., a compound serving as a supply source of the constitutional unit (a3)) and vinyl acetate is partially saponified to form a cationized polyvinyl alcohol that can be used as the macromolecular compound having the cation group.

In this case, the constitutional unit (a3) includes the cation group, and the monomer compound serving as a supply source of the constitutional unit (a3) is a compound copolymerizable with a vinyl alcohol lower ($C_1$ to $C_3$) fatty acid ester (i.e., a monomer compound serving as a supply source of the constitutional units (a1) and (a2)). The monomer compound serving as a supply source of the constitutional unit (a3) can be selected from a compound represented by the following general formula (3-1) and a compound represented by the following general formula (3-2). In terms of improving the polishing rate and the wettability of the surface of the silicon wafer, it is preferable that the constitutional unit (a3) is derived from at least one compound selected from the compound represented by the following general formula (3-1) and the compound represented by the following general formula (3-2).

[Chemical Formula 3]

(3-1)

(3-2)

In the above formulae, $R^1$, $R^2$, $R^3$, $R^7$, $R^8$, and $R^9$ independently represent a hydrogen atom or a $C_1$ to $C_3$ alkyl group. $X^1$ and Y independently represent a group selected from a $C_1$ to $C_{12}$ alkylene group, $—COOR^{12}—$, $—CONHR^{12}—$, $—OCOR^{12}—$, and $—R^{13}—OCO—R^{12}—$, where $R^{12}$ and $R^{13}$ independently represent a $C_1$ to $C_5$ alkylene group. $R^4$ represents a hydrogen atom, a $C_1$ to $C_3$ alkyl group, a $C_1$ to $C_3$ hydroxyalkyl group, or $R^1R^2C=C(R^3)—X^1—$. $R^5$ represents a hydrogen atom, a $C_1$ to $C_3$ alkyl group, or a $C_1$ to $C_3$ hydroxyalkyl group. $R^6$ represents a hydrogen atom, a $C_1$ to $C_3$ alkyl group, a $C_1$ to $C_3$ hydroxyalkyl group, or a benzyl group. $Z^-$ represents an anion. $R^{10}$ represents a hydrogen atom, a $C_1$ to $C_3$ alkyl group, a $C_1$ to $C_3$ hydroxyalkyl group, or $R^7R^8C=C(R^9)—Y—$. $R^{11}$ represents a hydrogen atom, a $C_1$ to $C_3$ alkyl group, or a $C_1$ to $C_3$ hydroxyalkyl group. $Z^-$ represents, e.g., a halogen ion.

The monomer compound serving as a supply source of the constitutional unit (a3) may be a compound selected, e.g., from diallyldialkyl (the carbon number of the alkyl group is 1 to 3) ammonium salt, N-(meth)acryloylaminoalkyl (the carbon number of the alkyl group is 1 to 5)-N,N-dialkyl (the carbon number of the alkyl group is 1 to 3) amine, N-(meth)acryloylaminoalkyl (the carbon number of the alkyl group is 1 to 5)-N,N,N-trialkyl (the carbon number of the alkyl group is 1 to 3) ammonium salt, N-(meth)acryloyloxyalkyl (the carbon number of the alkyl group is 1 to 5)-N,N,N-trialkyl (the carbon number of the alkyl group is 1 to 3) ammonium salt, and N-(ω-alkenyl (the carbon number of the alkenyl group is 2 to 10))-N,N-dialkyl (the carbon number of the alkyl group is 1 to 3) amine.

In terms of improving the polishing rate and the storage stability of the polishing composition, the total of the constitutional unit (a1), the constitutional unit (a2), and the constitutional unit (a3) is preferably 50 to 100 mol %, more preferably 80 to 100 mol %, even more preferably 90 to 100 mol %, and further preferably 100 mol % of all the constitutional units of the macromolecular compound having the cation group.

In terms of improving the polishing rate, the storage stability of the concentrated liquid, and the wettability of the surface of the silicon wafer and reducing clogging of a filter, the total of the constitutional unit (a3) including the cation group is 0.001 to 1.5 mol %, preferably 0.01 to 1 mol %, more preferably 0.01 to 0.5 mol %, and even more preferably 0.01 to 0.35 mol % of all the constitutional units of the macromolecular compound having the cation group. In this case, the total of the constitutional unit (a3) including the cation group can be measured by [Measurement method of cationization modification ratio] as described in Examples.

In terms of improving the solubility, the molar ratio (a1)/(a2) of the constitutional unit (a1) to the constitutional unit (a2) in the macromolecular compound having the cation group is preferably 1 to 300, more preferably 2 to 50, even more preferably 2.5 to 20, further preferably 3.0 to 15, and still further preferably 5.0 to 10.

In terms of improving the wettability of the surface of the silicon wafer, the degree of polymerization of the macromolecular compound having the cation group is preferably 220 to 20000, more preferably 220 to 10000, even more preferably 220 to 4500, further preferably 300 to 2000, and still further preferably 300 to 1000. The degree of polymerization of a macromolecular compound is generally the number of repeating units constituting a polymer molecule. In the case of the macromolecular compound having the cation group in the present invention, the degree of polymerization means the total number of repeating units of (a1) and (a2).

In terms of improving the wettability of the silicon wafer, the weight-average molecular weight of the macromolecular compound having the cation group is preferably 10,000 to 1,000,000, more preferably 10,000 to 500,000, even more preferably 10,000 to 200,000, further preferably 10,000 to 100,000, and still further preferably 10,000 to 50,000. In this case, the weight-average molecular weight can be determined by gel permeation chromatography using pullulan standards under the following measurement conditions.

<Measurement Method of Weight-Average Molecular Weight>

The weight-average molecular weight of the macromolecular compound having the cation group is a value calculated based on a peak in the chromatogram that is obtained by gel permeation chromatography (GPC) under the following conditions.

Column: α-M+α-M
Eluant: 0.15 mol/L $Na_2SO_4$, 1% $CH_3COOH$/water
Flow rate: 1.0 mL/min
Column temperature: 40° C.
Detector: RI detector
Reference material: pullulan (molecular weight: 788,000, 194,000, 47,300, and 5900, "Shodex" manufactured by SHOWA DENKO K.K.)

The macromolecular compound having the cation group in the polymer composition of the present invention may include constitutional units other than the constitutional units (a1) to (a3) as long as the effects of the present invention are not impaired. However, the macromolecular compound having the cation group preferably includes substantially no other constitutional units, and more preferably includes no other constitutional units.

In terms of improving the wettability of the surface of the silicon wafer, the content of the macromolecular compound having the cation group in the polishing composition of the present invention is preferably 0.0001 wt % (1 ppm by weight) or more, more preferably 0.0005 wt % (5 ppm by weight) or more, and even more preferably 0.001 wt % (10 ppm by weight) or more. In terms of improving the storage stability of the polishing composition, the content of the macromolecular compound having the cation group is preferably 0.1 wt % (1000 ppm by weight) or less, more preferably 0.02 wt % (200 ppm by weight) or less, and even more preferably 0.01 wt % (100 ppm by weight) or less. Therefore, the content of the macromolecular compound having the cation group is preferably 0.0001 to 0.1 wt % (1 to 1000 ppm by weight), more preferably 0.0005 to 0.02 wt % (5 to 200 ppm by weight), and even more preferably 0.001 to 0.01 wt % (10 to 100 ppm by weight).

(Abrasive)

An abrasive included in the polishing composition of the present invention is not particularly limited as long as it is in the form of abrasive grains generally used for polishing. For example, the abrasive may be particles containing at least one selected from the group consisting of silicon dioxide, aluminum oxide, cerium oxide, zirconium oxide, titanium oxide, silicon nitride, manganese dioxide, silicon carbide, zinc oxide, diamond, and magnesium oxide.

Specific examples of the materials for the abrasive include the following: silicon dioxides such as colloidal silica, fumed silica, and surface-modified silica; aluminum oxides such as α-alumina, γ-alumina, δ-alumina, θ-alumina, η-alumina, amorphous alumina, fumed alumina, and colloidal alumina; cerium oxide with an oxidation number of 3 (trivalent) or 4 (tetravalent), cerium oxide having a hexagonal system, an isometric system, or a face-centered cubic system, and the other cerium oxides; zirconium oxide having a monoclinic system or a tetragonal system, amorphous zirconium oxide, fumed zirconium, and the other zirconium oxides; titanium monoxide, titanium trioxide dititanium, titanium dioxide, fumed titania, and the other titanium oxides; α-silicon nitride, β-silicon nitride, amorphous silicon nitride, and the other silicon nitrides; and α-manganese dioxide, β-manganese dioxide, γ-manganese dioxide, δ-manganese dioxide, ε-manganese dioxide, η-manganese dioxide, and the other manganese dioxides.

Among the above materials for the abrasive, the silicon dioxide is preferred, and the colloidal silica is more preferred so as to improve the surface smoothness of the silicon wafer. These materials may be used individually or in combinations of two or more.

The abrasive is preferably used as slurry for ease of handling. When the abrasive included in the polishing composition of the present invention is colloidal silica, it is preferable that the colloidal silica is obtained from a hydrolysate of alkoxysilane to prevent contamination of the silicon wafer due to alkali metal, alkaline-earth metal, or the like. The silica particles obtained from the hydrolysate of alkoxysilane can be produced by a conventionally known method.

In terms of maintaining a constant polishing rate, the average primary particle size of the abrasive included in the polishing composition of the present invention is preferably 5 nm or more, more preferably 10 nm or more, and even more preferably 15 nm or more. In terms of suppressing the generation of scratches, the average primary particle size of the abrasive is preferably 50 nm or less, more preferably 45 nm or less, and even more preferably 40 nm or less. Therefore, the average primary particle size of the abrasive is preferably 5 to 50 nm, more preferably 10 to 45 nm, and even more preferably 15 to 40 nm.

In particular, when the abrasive is colloidal silica, the average primary particle size is preferably 5 to 50 nm, more preferably 10 to 45 nm, and even more preferably 15 to 40 nm to improve the polishing rate.

In terms of improving the polishing rate, the content of the abrasive in the polishing composition of the present invention is preferably 0.05 wt % or more, more preferably 0.1 wt % or more, and even more preferably 0.5 wt % or more. In terms of improving the storage stability of the polishing composition, the content of the abrasive is preferably 10 wt % or less, more preferably 7.5 wt % or less, even more preferably 5 wt % or less, and further preferably 2.5 wt % or less. Therefore, the content of the abrasive is preferably 0.05 to 10 wt %, more preferably 0.1 to 7.5 wt %, even more preferably 0.5 to 5 wt %, and further preferably 0.5 to 2.5 wt %.

The average primary particle size of the abrasive is determined using a specific surface area S ($m^2/g$) that is calculated by a BET (nitrogen adsorption) method. The specific surface area can be measured, e.g., by the method as described in Examples.

In terms of reducing the surface roughness, it is preferable that the degree of association of the abrasive is 3.0 or less, and that the abrasive has a so-called spherical shape or cocoon shape. Moreover, in terms of reducing the surface roughness and improving the polishing rate, it is preferable that the degree of association of the abrasive is preferably 1.1 to 3.0, and that the abrasive has a so-called cocoon shape. In terms of improving the polishing rate, the degree of association of the abrasive is preferably 1.8 or more, and more preferably 2.0 or more. In terms of reducing the surface roughness, the degree of association of the abrasive is preferably 2.5 or less, and more preferably 2.3 or less. When the abrasive is colloidal silica, the degree of association of the abrasive is preferably 1.1 to 3.0, and more preferably 1.8 to 2.5 to improve the polishing rate further.

The degree of association of the abrasive is a coefficient indicating the shape of the abrasive and can be calculated by the following formula.

Degree of association=average secondary particle size/average primary particle size A method for adjusting the degree of association of the abrasive is not particularly limited, and can be any of the methods disclosed in JP H6(1994)-254383 A, JP H11(199)-214338 A, JP H11(1999)-60232 A, JP 2005-060217 A, JP 2005-060219, etc.

The average secondary particle size is a value that can be measured by dynamic light scattering using, e.g., the device as described in Examples.

(Aqueous Medium)

An aqueous medium included in the polishing composition of the present invention may be, e.g., water or a mixed medium of water and a solvent. It is preferable that the solvent can be mixed with water (e.g., alcohol such as ethanol). In particular, the aqueous medium is preferably water, and more preferably ion-exchanged water.

The polishing composition of this embodiment may further include at least one optional component selected from a water-soluble macromolecular compound other than the macromolecular compound having the cation group, a basic compound, a pH adjuster, an antiseptic agent, alcohols, a chelating agent, a cationic surfactant, an anionic surfactant, a nonionic surfactant, and an oxidizing agent as long as the effects of the present invention are not impaired.

(Water-Soluble Macromolecular Compound)

In terms of improving the polishing rate, it is preferable that the polishing composition of the present invention further includes a water-soluble macromolecular compound other than the macromolecular compound having the cation group. In the context of the present invention, the water-soluble macromolecular compound is defined as a macromolecular compound having a water-soluble group that has a weight-average molecular weight of 10,000 or more, and preferably 100,000 or more, and that is other than the macromolecular compound having the cation group used in the present invention. The water-soluble group may be, e.g., a hydroxy group, a carboxyl group, a carboxylic acid ester group, or a sulfonic acid group. Examples of the water-soluble macromolecular compound include polyvinylpyrrolidone, poly(N-acylalkyleneimine), cellulose derivatives, polyvinyl alcohol, and polyethylene oxide. Examples of the poly(N-acylalkyleneimine) include poly(N-acetylethyleneimine), poly(N-propionylethyleneimine), poly(N-caproylethyleneimine), poly(N-benzoylethyleneimine), poly(N-nonadezoylethyleneimine), poly(N-acetylpropyleneimine), and poly(N-butionylethyleneimine). Examples of the cellulose derivatives include carboxymethyl cellulose, hydroxyethyl cellulose, hydroxyethyl methyl cellulose, hydroxypropyl cellulose, hydroxypropyl methyl cellulose, methyl cellulose, ethyl cellulose, ethyl hydroxyethyl cellulose, and carboxymethyl ethyl cellulose. Two or more types of these water-soluble macromolecular compounds may be mixed at any ratio.

In terms of improving the polishing rate and the wettability of the surface of the silicon wafer and reducing the adhesion of particles to the polished surface, the water-soluble macromolecular compound included in the polishing composition of the present invention is preferably at least one selected from the polyvinylpyrrolidone, the poly(N-acylalkyleneimine), and the hydroxyethyl cellulose, and more preferably at least one selected from the polyvinylpyrrolidone and the poly(N-acylalkyleneimine).

In terms of improving the polishing rate and the wettability of the surface of the silicon wafer and reducing the adhesion of particles to the polished surface, the viscosity-average molecular weight of the polyvinylpyrrolidone is preferably 10,000 to 3,000,000, more preferably 40,000 to 2,000,000, even more preferably 100,000 to 1,500,000, further preferably 300,000 to 1,500,000, and still further preferably 400,000 to 1,500,000. In this case, the viscosity-average molecular weight Mv is a value calculated from the following formula. The intrinsic viscosity η is the average of a value at an intercept obtained by plotting ($\eta_{rel}-1$) against the concentration of the polyvinylpyrrolidone and a value at an intercept obtained by plotting ($Ln\eta_{rel}$) against the concentration of the polyvinylpyrrolidone. Here, $\eta_{rel}$ represents the kinematic viscosity at 30° C. and can be measured in accordance with the method of JIS Z 8803 using a Cannon-Fenske capillary kinematic viscometer (viscometer No. 75).

$$[\eta]=KMv^a$$

η: intrinsic viscosity
Mv: viscosity-average molecular weight
$K=1.4\times10^{-4}$
$a=0.7$ In terms of improving the polishing rate and the wettability of the surface of the silicon wafer and reducing the adhesion of particles to the polished surface, the weight-average molecular weight (polystyrene standards) of the poly(N-acylalkyleneimine) is preferably 10,000 to 4,000,000, more preferably 10,000 to 2,000,000, even more preferably 10,000 to 1,500,000, further preferably 10,000 to 1,000,000, still further preferably 50,000 to 1,000,000, and particularly preferably 100,000 to 1,000,000. The measurement method of the weight-average molecular weight of the poly(N-acylalkyleneimine) is the same as that of the weight-average molecular weight of the macromolecular compound having the cation group except that the reference material is polystyrene.

In terms of improving the polishing rate and the wettability of the surface of the silicon wafer and reducing the adhesion of particles to the polished surface, the weight-average molecular weight (polyethylene glycol standards) of the hydroxyethyl cellulose is preferably 300,000 to 4,000,000, more preferably 600,000 to 3,000,000, and even more preferably 900,000 to 2,500,000. The measurement method of the weight-average molecular weight of the hydroxyethyl cellulose is the same as that of the weight-average molecular weight of the macromolecular compound having the cation group except that the reference material is polyethylene glycol.

In terms of improving the polishing rate, the content of the water-soluble macromolecular compound in the polishing composition of this embodiment is preferably 0.0001 wt % (1 ppm by weight) or more, more preferably 0.0005 wt % (5 ppm by weight) or more, even more preferably 0.001 wt % (10 ppm by weight) or more, and further preferably 0.002 wt % (20 ppm by weight) or more. In terms of improving the wettability of the surface of the silicon wafer, the content of the water-soluble macromolecular compound is preferably 5 wt % (50000 ppm by weight) or less, more preferably 1 wt % (10000 ppm by weight) or less, even more preferably 0.5 wt % (5000 ppm by weight) or less, further preferably 0.1 wt % (1000 ppm by weight) or less, and sill further preferably 0.05 wt % (500 ppm by weight) or less. Therefore, the content of the water-soluble macromolecular compound is preferably 0.0001 to 5 wt % (1 to 50000 ppm by weight), more preferably 0.0005 to 1 wt % (5 to 10000 ppm by weight), even more preferably 0.001 to 0.5 wt % (10 to 5000 ppm by weight), further preferably 0.001 to 0.1 wt % (10 to 1000 ppm by weight), and still further preferably 0.002 to 0.05 wt % (20 to 500 ppm by weight).

(Basic Compound)

In terms of improving the polishing rate, the polishing composition of the present invention preferably includes a basic compound. Examples of the basic compound include a nitrogen-containing basic compound and a hydroxide, a carbonate, and a bicarbonate of alkali metals or alkaline-earth metals. Examples of the nitrogen-containing basic compound include ammonia, ammonium hydroxide, ammonium carbonate, ammonium bicarbonate, methylamine, dimethylamine, trimethylamine, ethylamine, diethylamine, triethylamine, monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, N-(β-aminoethyl)ethanolamine, monoisopropanolamine, diisopropanolamine, triisopropanolamine, ethylenediamine, hexamethylenediamine, piperazine hexahydrate, anhydrous piperazine, 1-(2-aminoethyl)piperazine, N-methylpiperazine, diethylenetriamine, and tetramethyl ammonium hydroxide. Examples of the hydroxide, the carbonate, and the bicarbonate of alkali metals or alkaline-earth metals include potassium hydroxide, sodium hydroxide, potassium carbonate, potassium bicarbonate, sodium carbonate, and sodium bicarbonate. Two or more types of these basic compounds may be mixed. In terms of improving the polishing rate, the basic compound that can be included in the polishing composition of the present invention is preferably the nitrogen-containing basic compound, and more preferably ammonia or methylamine.

In terms of improving the polishing rate, the content of the basic compound in the polishing composition of the present invention is preferably 0.001 wt % or more, more preferably 0.01 wt % or more, and even more preferably 0.02 wt % or more. In terms of preventing corrosion of a semiconductor substrate, the content of the basic compound is preferably 10 wt % or less, more preferably 5 wt % or less, even more preferably 1 wt % or less, and further preferably 0.5 wt % or less. Therefore, the content of the basic compound is preferably 0.001 to 10 wt %, more preferably 0.01 to 5 wt %, even more preferably 0.02 to 1 wt %, and further preferably 0.02 to 0.5 wt %.

(pH Adjuster)

The pH adjuster may be, e.g., an acid compound. Examples of the acid compound include inorganic acids such as sulfuric acid, hydrochloric acid, nitric acid, and phosphoric acid and organic acids such as acetic acid, oxalic acid, succinic acid, glycolic acid, malic acid, citric acid, and benzoic acid.

(Antiseptic Agent)

Examples of the antiseptic agent include benzalkonium chloride, benzethonium chloride, 1,2-benzisothiazolin-3-one, (5-chloro-)2-methyl-4-isothiazoline-3-one, hydrogen peroxide, and hypochlorite.

(Alcohols)

Examples of the alcohols include methanol, ethanol, propanol, butanol, isopropyl alcohol, 2-methyl-2-propanol, ethylene glycol, propylene glycol, polyethylene glycol, and glycerin. The content of the alcohols in the polishing composition of the present invention is preferably 0.1 to 5 wt %.

(Chelating Agent)

Examples of the chelating agent include ethylenediaminetetraacetic acid, sodium ethylenediaminetetraacetic acid, nitrilotriacetic acid, sodium nitrilotriacetic acid, ammonium nitrilotriacetic acid, hydroxyethylethylenediaminetriacetic acid, sodium hydroxyethylethylenediaminetriacetic acid, triethylenetetraminehexaacetic acid, and sodium triethylenetetraminehexaacetic acid. The content of the chelating agent in the polishing composition of the present invention is preferably 0.01 to 1 wt %.

(Cationic Surfactant)

Examples of the cationic surfactant include aliphatic amine salt and aliphatic ammonium salt.

(Anionic Surfactant)

Examples of the anionic surfactant include fatty acid soap, carboxylates such as alkyl ether carboxylate, sulfonates such as alkyl benzene sulfonate and alkyl naphthalene sulfonate, sulfates such as fatty alcohol sulfate and alkyl ether sulfate, and phosphates such as alkyl phosphate.

(Nonionic Surfactant)

In terms of improving the polishing rate and suppressing corrosion of the wafer, the polishing composition of the present invention preferably includes a nonionic surfactant. Examples of the nonionic surfactant include ether types such as polyoxyethylene alkyl ether, ether ester types such as polyoxyethylene ether of glycerol ester, and ester types such as polyethylene glycol fatty acid ester, glycerol ester, and sorbitan ester. Among the above nonionic surfactants, the ether-type nonionic surfactant is preferred, and the polyoxyethylene alkyl ether is more preferred so as to improve the polishing rate and to suppress corrosion of the wafer. Although the reason the nonionic surfactant can prevent corrosion is not clear, it is estimated that the hydrophobic group of the nonionic surfactant is adsorbed on the silicon wafer to form a protective film, thereby suppressing the contact with alkaline substances.

In terms of suppressing a reduction in the polishing rate, the content of the nonionic surfactant in the polishing composition of the present invention is preferably 0.01 wt % (100 ppm by weight) or less, more preferably 0.005 wt % (50 ppm by weight) or less, even more preferably 0.0025 wt % (25 ppm by weight) or less, and further preferably 0.001 wt % (10 ppm by weight) or less. In terms of preventing corrosion of the semiconductor substrate, the content of the nonionic surfactant is preferably 0.00005 wt % (0.5 ppm by weight) or more, more preferably 0.0001 wt % (1 ppm by weight) or more, even more preferably 0.0003 wt % (3 ppm by weight) or more, and further preferably 0.0004 wt % (4 ppm by weight) or more. Therefore, the content of the nonionic surfactant is preferably 0.00005 to 0.01 wt % (0.5 to 100 ppm by weight), more preferably 0.0001 to 0.005 wt % (1 to 50 ppm by weight), even more preferably 0.0003 to 0.0025 wt % (3 to 25 ppm by weight), and further preferably 0.0004 to 0.001 wt % (4 to 10 ppm by weight).

In terms of the solubility of the nonionic surfactant in the polishing composition of the present invention, a HLB of the nonionic surfactant in the polishing composition is preferably 8 or more, more preferably 10 or more, and even more preferably 12 or more. In terms of preventing corrosion, the HLB of the nonionic surfactant is preferably 19.5 or less, more preferably 18 or less, and even more preferably 16 or less. Therefore, the HLB of the nonionic surfactant is preferably 8 to 19.5, more preferably 10 to 18, and even more preferably 12 to 16. In the present specification, the HLB is calculated by the Griffin's method using the formula: HLB=20×(the weight percentage of a hydrophilic group).

In terms of the storage stability of the polishing composition, the cloudy point of the nonionic surfactant in the polishing composition of the present invention is preferably 30° C. or more, more preferably 35° C. or more, and even more preferably 40° C. or more.

(Oxidizing Agent)

Examples of the oxidizing agent include peroxides such as permanganic acid and peroxo acid, chromic acid, nitric acid, and salts thereof.

In this embodiment, the pH of the polishing composition at 25° C. is not particularly limited, and is preferably 8.0 to 12.0, more preferably 9.0 to 11.5, and even more preferably 9.5 to 11.0 so as to improve the polishing rate. In this case, the pH of the polishing composition at 25° C. can be measured using a pH meter (HM-30G manufactured by DKK-TOA CORPORATION) and is read on the pH meter 1 minute after dipping an electrode into the polishing composition.

The amount of liquid of the polishing composition of the present invention that passes through a filter is preferably 1.0 g/min·cm² or more, and more preferably 2.0 g/min·cm² or more in the following standard test A. In terms of reducing the LPD such as nanoscratch, the amount of liquid of the polishing composition passing through a filter is preferably 3.7 g/min·cm² or more, more preferably 5 g/min·cm² or more, even more preferably 10 g/min·cm² or more, and further preferably 12 g/min·cm² or more. This amount can be adjusted, e.g., by reducing the viscosity of the polishing composition, improving the dispersibility of the abrasive in the polishing composition, or removing an agglomerate of the abrasive in the polishing composition by filtration or the like.

(Standard Test A)

(1) Temperature in the laboratory: 25° C.

(2) Suction pressure: −100 kPa (3) Filter: membrane filter

Material: hydrophilic PTFE (polytetrafluoroethylene)

Pore size: 0.5 μm (corresponding to a pressure of 0.14 MPa or more when the polishing composition starts to come out through the filter in the method of JIS K3832)

Thickness: 35 μm

Filtration area: 17.3 cm² (diameter=47 mm)

The membrane filter may be, e.g., "H050A047A" manufactured by Advantec Toyo Kaisha, Ltd.

(4) Operation: 300 g of the polishing composition is drawn into a suction filtration apparatus equipped with the membrane filter under the above suction pressure for 2 seconds, and the weight of the polishing composition that has passed through the filter for 1 minute immediately after drawing the polishing composition is measured. This weight is divided by the filtration area of the filter used in the standard test A, and the resultant value is defined as the amount of liquid of the polishing composition passing through the filter. The pressure can be reduced by any method, e.g., using a water-circulating aspirator.

The content of each of the components described above is the amount when the polishing composition is being used. However, the polishing composition of this embodiment may be stored and supplied in a concentrated state as long as the storage stability is not impaired. This is preferred because the production and transportation costs can be reduced further. The concentrated liquid may be appropriately diluted with the above aqueous medium as needed.

When the polishing composition of this embodiment is the concentrated liquid, in terms of reducing the production and transportation costs, the content of the macromolecular compound having the cation group is preferably 0.005 wt % or more, more preferably 0.01 wt % or more, and even more preferably 0.02 wt % or more. In terms of improving the storage stability, the content of the macromolecular compound having the cation group in the concentrated liquid is preferably 5 wt % or less, more preferably 2 wt % or less, and even more preferably 1 wt % or less. Therefore, the content of the macromolecular compound having the cation group in the concentrated liquid is preferably 0.005 to 5 wt %, more preferably 0.01 to 2 wt %, and even more preferably 0.02 to 1 wt %.

When the polishing composition of this embodiment is the concentrated liquid, in terms of reducing the production and transportation costs, the content of the abrasive is preferably 5 wt % or more, more preferably 7 wt % or more, and even more preferably 8 wt % or more. In terms of improving the storage stability, the content of the abrasive in the concentrated liquid is preferably 40 wt % or less, more preferably 35 wt % or less, and even more preferably 30 wt % or less. Therefore, the content of the abrasive in the concentrated liquid is preferably 5 to 40 wt %, more preferably 7 to 35 wt %, and even more preferably 8 to 30 wt %.

When the polishing composition of this embodiment is the concentrated liquid, in terms of reducing the production and transportation costs, the content of the water-soluble macromolecular compound is preferably 0.02 wt % or more, more preferably 0.05 wt %, and even more preferably 0.1 wt % or more. In terms of improving the storage stability, the content of the water-soluble macromolecular compound in the concentrated liquid is preferably 5 wt % or less, more preferably 2 wt % or less, and even more preferably 1 wt % or less. Therefore, the content of the water-soluble macromolecular compound in the concentrated liquid is preferably 0.02 to 5 wt %, more preferably 0.05 to 2 wt %, and even more preferably 0.1 to 1 wt %.

Next, an example of a method for producing the polishing composition of this embodiment will be described.

An example of the method for producing the polishing composition of this embodiment is not particularly limited. For example, the polishing composition can be prepared by mixing the macromolecular compound having the cation group, the abrasive, and the aqueous medium, and the optional component as needed.

The order in which these components are mixed is not particularly limited, and all the components may be mixed at the same time. When the water-soluble macromolecular compound is to be added as the optional component, the abrasive may be mixed with the aqueous medium in which the water-soluble macromolecular compound has been previously dissolved. In this case, the latter is preferred so as to sufficiently prevent agglomeration or the like of the abrasive.

The abrasive can be dispersed in the aqueous medium using any stirring device such as a homomixer, a homogenizer, an ultrasonic disperser, a wet ball mill, or a bead mill. If coarse particles resulting from the agglomeration or the like of the abrasive are present in the aqueous medium, it is preferable that the coarse particles should be removed by centrifugal separation, filtration with a filter, etc. The abrasive is dispersed in the aqueous medium preferably in the presence of the water-soluble macromolecular compound.

The polishing composition of the present invention is used, e.g., for a polishing step of a silicon wafer in the process of manufacturing a semiconductor substrate.

The polishing step of a silicon wafer includes a lapping (rough polishing) step and a final polishing step. The lapping step includes planarizing the silicon wafer that has been obtained by slicing a silicon single crystal ingot into thin disks. The final polishing step includes etching the lapped silicon wafer and then mirror finishing the surfaces of the silicon wafer. It is more preferable that the polishing composition of the present invention is used in the final polishing step.

EXAMPLES

<Average Primary Particle Size of Abrasive>

The average primary particle size (nm) of the abrasive was determined by the following formula using a specific surface area S (m²/g) that was calculated by the BET (nitrogen adsorption) method.

Average primary particle size (nm)=2727/S

The specific surface area of the abrasive was determined in the following manner. After the following "pretreatment" was performed, a measurement sample of about 0.1 g was accurately weighed in a measuring cell to four decimal places. The measurement sample was dried in an atmosphere at 110° C. for 30 minutes immediately before measuring the specific surface area. Then, the specific surface area was measured by the nitrogen adsorption (BET) method using a specific surface area measuring device (Micromeritics Automatic Surface Area Analyzer, FlowSorb III 2305 manufactured by Shimadzu Corporation).

[Pretreatment]

(a) The abrasive in the form of slurry was adjusted to pH 2.5±0.1 with a nitric acid aqueous solution.

(b) The abrasive in the form of slurry having an adjusted pH of 2.5±0.1 was put in a petri dish and dried in a hot air dryer at 150° C. for 1 hour.

(c) After drying, the resultant sample was pulverized in an agate mortar.

(d) The pulverized sample was allowed to be suspended in ion-exchanged water at 40° C., and this suspension was filtered through a membrane filter with a pore size of 1 μm (e) The substances deposited on the filter were washed five times with 20 g of ion-exchanged water (40° C.).

(f) The filter to which the substances were attached was put in a petri dish and dried in an atmosphere at 110° C. for four hours.

(g) The dried substances (abrasive grains) were taken out so as not to be mixed with filter scraps and pulverized in a mortar, thereby providing a measurement sample.

<Average Secondary Particle Size of Abrasive>

The average secondary particle size (nm) of the abrasive was determined in the following manner. The abrasive was added to ion-exchanged water so that the concentration of the abrasive was 0.5 wt %. The resultant aqueous solution was poured into a disposable sizing cuvette (made of polystyrene, 10 mm cell) to a height of 10 mm from the bottom, and then was measured by dynamic light scattering (device name: Zetasizer Nano ZS manufactured by SYSMEX CORPORATIO).

(1) Preparation of Polishing Composition

Concentrated liquids of polishing compositions (pH 10.0 to 11.0 (25° C.)) were produced by mixing and stir-ring the abrasives (colloidal silica), the macromolecular compounds having the cation group, 28% ammonia water (special grade chemicals manufactured by Kishida Chemical Co., Ltd.), and ion-exchanged water, and optionally the other macromolecular compounds or the nonionic surfactants. The content of ammonia in each of the concentrated liquids was 0.4 wt %. Table 1 shows the degree of polymerization and composition of the macromolecular compounds 1 to 11 having the cation group used in the following Examples 1 to 43.

Each of the macromolecular compounds 1 to 11 was obtained by copolymerizing a monomer compound serving as a supply source of the constitutional unit (a2) and a monomer compound serving as a supply source of the constitutional unit (a3), and partially saponifying the copolymer thus formed.

TABLE 1

| | Degree of polymerization | (a1)/(a2) | (a3) mol % |
|---|---|---|---|
| Macromolecular compound 1 | 550 | 6.5 | 0.02 |
| Macromolecular compound 2 | 550 | 6.5 | 0.05 |
| Macromolecular compound 3 | 550 | 6.5 | 0.13 |
| Macromolecular compound 4 | 550 | 6.5 | 0.19 |
| Macromolecular compound 5 | 550 | 6.5 | 0.22 |
| Macromolecular compound 6 | 550 | 6.5 | 0.30 |
| Macromolecular compound 7 | 550 | 6.5 | 0.39 |
| Macromolecular compound 8 | 550 | 6.5 | 0.49 |
| Macromolecular compound 9 | 1700 | 6.6 | 0.90 |
| Macromolecular compound 10 | 600 | 3.4 | 0.37 |
| Macromolecular compound 11 | 1700 | 8.1 | 0.29 |

(Note) In the macromolecular compounds 10 to 11 in Table 1, the total of the constitutional unit (a1), the constitutional unit (a2), and the constitutional unit (a3) is 100 mol % of all the constitutional units of each of the macromolecular compounds. R is $CH_3$, and the monomer compound serving as a supply source of the constitutional unit (a2) is vinyl acetate. The constitutional unit (a3) is derived from the compound represented by the above general formula (3-1), where $Z^-$ is $Cl^-$, $X^1$ is —$CONHR^{12}$—, $R^{12}$ is —$(CH_2)_3$, $R^1$ is —H, $R^2$ is —H, $R^3$ is —$CH_3$, $R^4$ is H, $R^5$ is H, and $R^6$ is H. In this case, the CO side of —$CONHR^{12}$ is bonded to the carbon atom to which $R^3$ is bonded.

In the macromolecular compounds 1 to 9 in Table 1, the total of the constitutional unit (a1), the constitutional unit (a2), and the constitutional unit (a3) is 100 mol % of all the constitutional units of each of the macromolecular compounds. R is $CH_3$, and the monomer compound serving as a supply source of the constitutional unit (a2) is vinyl acetate. The constitutional unit (a3) is derived from the compound represented by the above general formula (3-1), where $Z^-$ is $Cl^-$, $X^1$ is —$CH_2$—, $R^1$ is —H, $R^2$ is —H, $R^3$ is —H, $R^4$ is $R^1R^2C=C(R^3)$—$X^1$—, $R^5$ is H, and $R^6$ is H.

In Table 1, the mole percentage of the constitutional unit (a3) was calculated based on the amount of nitrogen and the chlorine concentration that were determined by the following method for measuring a cationization modification ratio.

[Measurement Method of Cationization Modification Ratio]

(1) A sample of 1 to 5 mg was accurately weighed with an ultramicrobalance. Then, the sample was decomposed and converted into NO under argon-oxygen flow in the presence of a catalyst. The chemiluminescence intensity produced when this NO reacted with ozone was measured to obtain the amount of nitrogen. The sample was manually burned and decomposed while the condition of the sample was confirmed. In this case, the visual observation and the detected intensity showed that incomplete combustion did not occur.

Measuring device: TN-10 manufactured by Mitsubishi Chemical Analytech Co., Ltd.

Setting conditions of electric furnace: INLET 800° C., OUTLET 900° C.

Gas flow rate: $O_2$ (main) 300 ml/min, Ar 1 L/l min, $O_2$ 0.5 L/min

Calibration curve adjustment: A solution obtained by dissolving aniline in toluene was used as a sample for a calibration curve.

(2) On the other hand, a sample of 100 mg was burned under oxygen flow, and the generated gas was absorbed by a 3% hydrogen peroxide solution. The chloride ions in the absorbing solution were measured by ion chromatography to obtain the chlorine concentration.

Combustion equipment: QS-AB2 manufactured by Yoshida Kagaku Kikai Co., Ltd.

Combustion temperature: PREH 400° C., HIH 1000° C.
Combustion gas flow rate: 2.5 L/min (Ar)
Measuring device: ICS-2000 manufactured by Dionex Corporation
Separation column: IonPack AS418
Guard column: IonPack AG18
Eluant 30 mM KOH
Detector: electric conductivity detector (3) Each of the macromolecular compounds 1 to 11 contained N and Cl at a molar ratio of 1:1, and the supply source of the constitutional unit (a3) contained one N atom and one Cl atom. Therefore, the content (mol %) of the cation group was calculated from each of the amount of nitrogen and the chlorine concentration, and the average of those contents was defined as the amount (mol %) of the constitutional unit (a3).

The above concentrated liquids were diluted by 20 times with ion-exchanged water to prepare the polishing compositions having a pH of 10.0 to 11.0 (25° C.). In each of the polishing compositions, the content of the abrasive was 0.5 wt % and the content of ammonia was 0.02 wt %. Moreover, the content of the macromolecular compound having the cation group, the content of the water-soluble macromolecular compound other than the macromolecular compound having the cation group, and the content of the nonionic surfactant were as shown in Tables 2 and 3.

(2) Polishing Method

Using the polishing compositions thus prepared, the following silicon wafer was polished for 15 minutes under the following polishing conditions.

<Silicon Wafer>

An 8-inch silicon wafer with one side mirror finished (obtained after two-stage polishing, thickness: 0.7 mm) was cut into 4 cm×4 cm and used.

<Polishing Conditions>

Polishing machine: a single-sided polishing machine MA-300 (platen diameter: 300 mm, manufactured by Musashino Electronic Co., Ltd.)

Polishing pad: SUPREME RN-H (manufactured by NITTA HAAS INCORPORATED)

Number of revolutions of rotary table: 90 r/min (linear velocity: 45 m/min)

Number of revolutions of platen: 16 r/min

Supply of polishing composition: 15 ml/min (the polishing composition was supplied to the center of the rotary table)

Polishing load: 100 g/cm$^2$

Polishing time: 15 min

The silicon wafer polished under the above polishing conditions was washed using a wafer jet washer WJS-150B (manufactured by Mtech Co., Ltd.) and then dried. Specifically, a spin rinse with ion-exchanged water (at a rotational speed of 1500 rpm for 30 seconds), a scrub rinse with ion-exchanged water (at a rotational speed of 100 rpm for 60 seconds), and a spin rinse with ion-exchanged water (at a rotational speed of 1500 rpm for 30 seconds) were performed in this order, and subsequently spin thy (at a rotational speed of 3000 rpm for 30 seconds) was performed.

(3) Evaluation Method

<Storage Stability of Concentrated Liquid>

100 g of each of the concentrated liquids was placed in a 100 ml screw tube and sealed. After one day, the storage stability was checked. The concentrated liquids were stored in a room at 23° C.

x: An agglomerate was formed and a separation occurred one day after the preparation of the concentrated liquid.

◯: No agglomerate was formed, no separation occurred, and the dispersion stability was maintained one day after the preparation of the concentrated liquid.

<Evaluation of Polishing Rate>

The polishing rate when using the polishing compositions of Examples 1 to 43 and Comparative Examples 1 to 4 was evaluated in the following manner. First, the weights of each silicon wafer before and after polishing were measured with a scale ("BP-210S" manufactured by Sartorius Ltd.). Then, the weight difference was divided by the density; area, and polishing time of each silicon wafer, so that the polishing rate per unit time for one side of the silicon wafer was determined. In Tables 2 and 3, the polishing rate is shown as a relative value calculated by assuming that the polishing rate for one side of the silicon wafer in the case of using the polishing composition in Comparative Example 4 was "1.00".

<Evaluation of Amount of Liquid Passing Through Filter>

(1) Suction pressure setting means: Using a water-circulating aspirator ("CIRCULATING ASPIRATOR WJ-15" manufactured by SIBATA SCIENTIFIC TECHNOLOGY LTD.), a pressure gage was connected between the aspirator and the suction filtration apparatus (at a position 20 cm away from the suction filtration apparatus), and the pressure during the filtration was adjusted to −100 kPa. The temperature in the laboratory was set to 25° C.

(2) Suction filtration apparatus: 1 L suction bottle provided with a filter holder for filtration under reduced pressure (model number: KGS-47, manufactured by Advantec Toyo Kaisha, Ltd.)

(3) Filter: membrane filter ("H050A047A" manufactured by Advantec Toyo Kaisha, Ltd.), material: hydrophilic PTFE, pore size: 0.5 μm, thickness: 35 μm, filtration area: 17.3 cm$^2$ (diameter=47 mm)

(4) Length of time that liquid passes through the filter: 1 minute (i.e., 1 minute from the point at which the introduction of 300 g of the polishing composition into a funnel on the filter for 2 seconds was completed)

(5) Amount of liquid passing through the filter: The weight (g) of the polishing composition in the suction bottle after passing through the filter for 1 minute was divided by the filtration area of the filter.

<Evaluation of Wettability of Surface of Silicon Wafer (Wetted Area of silicon Wafer)>

As a pretreatment, a silicon wafer cut into 40×40 mm square was immersed in a 1% diluted hydrofluoric acid aqueous solution for 2 minutes to remove the oxide film, and subsequently the silicon wafer was immersed in ion-exchanged water for an instant, rinsed, and dried by air blow. Next, the silicon wafer was immersed in each of the polishing compositions for 20 seconds, and then raised and allowed to stand still in the air for 15 seconds. After the liquid pool in the lower portion of the silicon wafer was removed with a Kimwipe, the area of a hydrophilic portion on the mirror surface of the silicon wafer was visually judged. The measurement was performed three times, and the average of the measured values was calculated. In this case, the wettability was 100% if the entire surface of one of the principal surfaces of the silicon wafer was wet.

<Evaluation of Amount of Corrosion>

A silicon wafer cut into 40×40 mm square was immersed in a 1% diluted hydrofluoric acid aqueous solution for 2 minutes to remove the oxide film, and subsequently the silicon wafer was immersed in ion-exchanged water for an instant, rinsed, and dried by air blow. Next, the silicon wafer was placed in a plastic container, and then 20 g of the polishing composition was added to the plastic container and covered with a lid. After the silicon wafer was immersed in the polishing composition at 80° C. for 5 hours, the silicon wafer was immersed in ion-exchanged water for an instant, rinsed, and dried by air blow. The amount by which the weight of the air-blow dried silicon wafer was decreased before and after the immersion in the polishing composition was defined as the amount of corrosion.

TABLE 2

| | | Abrasive | Macromolecular compound (1) | (a3) mol % | Content (ppm by weight) | Macromolecular compound (2) | Content (ppm by weight) | Nonionic surfactant | Content (ppm by weight) |
|---|---|---|---|---|---|---|---|---|---|
| Examples | 1 | Silica 2 | Macromolecular compound 1 | 0.02 | 25 | | | | |
| | 2 | | | | 50 | | | | |
| | 3 | | | | 100 | | | | |
| | 4 | | Macromolecular compound 2 | 0.05 | 25 | | | | |
| | 5 | | | | 50 | | | | |
| | 6 | | | | 100 | | | | |
| | 7 | | Macromolecular compound 3 | 0.13 | 50 | | | | |
| | 8 | | | | 100 | | | | |
| | 9 | | Macromolecular compound 4 | 0.19 | 50 | | | | |
| | 10 | | | | 100 | | | | |
| | 11 | | Macromolecular compound 5 | 0.22 | 25 | | | | |
| | 12 | | | | 50 | | | | |
| | 13 | | | | 100 | | | | |
| | 14 | | Macromolecular compound 6 | 0.30 | 25 | | | | |
| | 15 | | | | 50 | | | | |
| | 16 | | | | 100 | | | | |
| | 17 | | Macromolecular compound 7 | 0.39 | 25 | | | | |
| | 18 | | | | 50 | | | | |
| | 19 | | | | 100 | | | | |
| | 20 | | Macromolecular compound 8 | 0.49 | 25 | | | | |
| | 21 | | | | 50 | | | | |
| | 22 | | | | 100 | | | | |
| | 23 | | Macromolecular compound 9 | 0.90 | 20 | | | | |
| | 24 | | | | 50 | | | | |
| | 25 | | | | 100 | | | | |

| | | Stability of concentrated liquid | Amount of liquid passing through filter (g/min · cm²) | Polishing rate (relative value) | Amount of corrosion (mg) | Wettability (%) |
|---|---|---|---|---|---|---|
| Examples | 1 | ○ | 16.7 | 1.06 | 3.8 | 80 |
| | 2 | ○ | 15.5 | 1.14 | 3.8 | 81 |
| | 3 | ○ | 15.1 | 1.03 | 3.7 | 95 |
| | 4 | ○ | 15.4 | 1.08 | 3.6 | 82 |
| | 5 | ○ | 14.2 | 1.18 | 3.4 | 84 |
| | 6 | ○ | 13.9 | 1.04 | 3.3 | 96 |
| | 7 | ○ | 13.5 | 1.20 | 3.1 | 93 |
| | 8 | ○ | 12.6 | 1.05 | 3.4 | 100 |
| | 9 | ○ | 11.2 | 1.32 | 3.0 | 97 |
| | 10 | ○ | 10.9 | 1.06 | 3.8 | 100 |
| | 11 | ○ | 10.2 | 1.10 | 3.4 | 90 |
| | 12 | ○ | 9.7 | 1.43 | 3.2 | 100 |
| | 13 | ○ | 7.6 | 1.07 | 3.2 | 100 |
| | 14 | ○ | 8.9 | 1.12 | 3.3 | 95 |
| | 15 | ○ | 7.7 | 1.53 | 3.1 | 100 |
| | 16 | ○ | 6.1 | 1.16 | 3.2 | 100 |
| | 17 | ○ | 8.6 | 1.14 | 2.9 | 79 |
| | 18 | ○ | 7.1 | 1.61 | 3.4 | 90 |
| | 19 | ○ | 6.0 | 1.50 | 3.5 | 91 |
| | 20 | ○ | 6.5 | 1.12 | 3.6 | 64 |
| | 21 | ○ | 5.5 | 1.58 | 3.5 | 88 |
| | 22 | ○ | 5.1 | 1.56 | 3.8 | 91 |
| | 23 | ○ | 2.0 | 1.10 | 4.6 | 40 |
| | 24 | ○ | 2.0 | 1.55 | 43 | 71 |
| | 25 | ○ | 1.0 | 1.83 | 4.5 | 83 |

TABLE 3

|  | | Abrasive | Macromolecular compound (1) | (a3) mol % | Content (ppm by weight) | Macromolecular compound (2) | Content (ppm by weight) | Nonionic surfactant |
|---|---|---|---|---|---|---|---|---|
| Examples | 26 | Silica 2 | Macromolecular compound 10 | 0.37 | 25 | | | |
|  | 27 | | | | 50 | | | |
|  | 28 | | | | 100 | | | |
|  | 29 | | Macromolecular compound 11 | 0.29 | 25 | | | |
|  | 30 | | | | 50 | | | |
|  | 31 | | | | 100 | | | |
|  | 32 | | Macromolecular compound 5 | 0.22 | 50 | | | surfactant (*7) |
|  | 33 | | | | 50 | | | surfactant (*8) |
|  | 34 | | | | 50 | | | surfactant (*9) |
|  | 35 | | Macromolecular compound 6 | 0.30 | 50 | | | surfactant (*7) |
|  | 36 | | | | 50 | | | surfactant (*8) |
|  | 37 | | | | 50 | | | surfactant (*9) |
|  | 38 | | Macromolecular compound 10 | 0.37 | 40 | poly(N-propionylethyleneimine) (*5) | 40 | |
|  | 39 | | | | 40 | polyvinylpyrrolidone (*6) | 40 | |
|  | 40 | Silica 1 | Macromolecular compound 5 | 0.22 | 50 | | | |
|  | 41 | | | | 50 | | | surfactant (*7) |
|  | 42 | | | | 50 | | | surfactant (*8) |
|  | 43 | | | | 50 | | | surfactant (*9) |
| Comparative Examples | 1 | Silica 2 | Completely saponified polyvinyl alcohol (*1) | 0 | 50 | | | |
|  | 2 | Silica 2 | Cationic polyvinyl alcohol (*2) | 2.2 | 20 | | | |
|  | 3 | Silica 2 | Polyethyleneimine (*3) | — | 50 | | | |
|  | 4 | Silica 2 | HEC (*4) | — | 200 | | | |

|  | | Content (ppm by weight) | Stability of concentrated liquid | Amount of liquid passing through filter (g/min·cm²) | Polishing rate (relative value) | Amount of corrosion (mg) | Wettability (%) |
|---|---|---|---|---|---|---|---|
| Examples | 26 | | ○ | 12.8 | 1.08 | 3.6 | 100 |
|  | 27 | | ○ | 10.1 | 1.35 | 3.6 | 100 |
|  | 28 | | ○ | 8.2 | 1.07 | 3.4 | 100 |
|  | 29 | | ○ | 13.1 | 1.05 | 3.5 | 100 |
|  | 30 | | ○ | 10.9 | 1.33 | 3.3 | 100 |
|  | 31 | | ○ | 9.9 | 1.04 | 3.4 | 100 |
|  | 32 | 5 | ○ | 9.9 | 1.41 | 2.7 | 100 |
|  | 33 | 5 | ○ | 10.1 | 1.03 | 2.1 | 91 |
|  | 34 | 5 | ○ | 9.5 | 1.23 | 0.6 | 84 |
|  | 35 | 5 | ○ | 8.1 | 1.46 | 2.6 | 100 |
|  | 36 | 5 | ○ | 8.0 | 1.10 | 2.0 | 92 |
|  | 37 | 5 | ○ | 7.9 | 1.33 | 0.7 | 84 |
|  | 38 | | ○ | 8.5 | 1.15 | 3.6 | 100 |
|  | 39 | | ○ | 8.7 | 1.49 | 3.7 | 100 |
|  | 40 | | ○ | 9.8 | 1.48 | 3.4 | 100 |
|  | 41 | 5 | ○ | 10.1 | 1.43 | 1.9 | 100 |
|  | 42 | 5 | ○ | 10.2 | 1.08 | 1.1 | 89 |
|  | 43 | 5 | ○ | 9.5 | 1.33 | 0.5 | 76 |
| Comparative Examples | 1 | | ○ | 7.9 | 0.60 | 3.7 | 20 |
|  | 2 | | X | 0.4 | Formation of agglomerate | 5.6 | 20 |
|  | 3 | | X | 17.3 | Formation of agglomerate | 46.2 | 90 |
|  | 4 | | ○ | 0.1 | 1.00 | 6.4 | 100 |

(Note) In Tables 2 and 3, the macromolecular compounds 1 to 11 in a column headed "macromolecular compound (1)" are examples of the macromolecular compound having the cation group in the present invention, and the macromolecular compound (2) shows examples of the water-soluble macromolecular compound other than the macromolecular compound having the cation group. The abrasives and the components *1 to *9 in Tables 2 and 3 are described in detail below.

Silica 1: average primary particle size: 26 nm, average secondary particle size: 58 nm, degree of association: 2.2

Silica 2: average primary particle size: 38 nm, average secondary particle size: 78 nm, degree of association: 2.1

Component *1: completely saponified polyvinyl alcohol, PVA-124 manufactured by KURARAY CO., LTD.

Component *2: cationic polyvinyl alcohol, CM-318 manufactured by KURARAY CO., LTD.

Component *3: polyethyleneimine, SP-006 manufactured by NIPPON SHOKUBAI CO., LTD.

Component *4: HEC, CF-V, weight-average molecular weight: 1,600,000, manufactured by Sumitomo Seika Chemicals Company Limited Component *5: poly(N-propionylethyleneimine), weight-average molecular weight: 770,000, manufactured by Kao Corporation Component *6: polyvinylpyrrolidone, K90, viscosity-average molecular weight: 590,000, manufactured by Wako Pure Chemical Industries, Ltd.

Component *7: polyoxyethylene alkyl ether (EMULGEN 3140S-90, HLB=19, manufactured by Kao Corporation)

Component *8: polyoxyethylene alkyl ether (EMULGEN 350, HLB=18, manufactured by Kao Corporation)

Component *9: polyoxyethylene alkyl ether (EMULGEN 409PV, HLB=14, manufactured by Kao Corporation)

As shown in Tables 2 and 3, in the polishing compositions of Examples 1 to 43, the storage stability of the concentrated liquid was good, the amount of liquid passing through the filter was large, the wettability of the silicon wafer was good, and also the polishing rate was improved. In contrast, the polishing compositions of Comparative Examples 1 to 2 had poor wettability, and the polishing compositions of Comparative Examples 2 to 3 had low storage stability of the concentrated liquid. Moreover, when the polishing compositions of Comparative Examples 2 to 3 were supplied to the polishing pad, there were agglomerates large enough to be visually identified. It was clear that such agglomerates would be the cause of scratches. In the polishing composition of Comparative Example 4, the amount of liquid passing through the filter was small.

INDUSTRIAL APPLICABILITY

The use of the polishing composition of the present invention can achieve high-speed polishing of a silicon wafer, and also can reduce clogging of a filter. Therefore, the polishing composition of the present invention is useful as a polishing composition that is to be used in the process of manufacturing various semiconductor substrates, and particularly useful as a polishing composition for final polishing of a silicon wafer.

The invention claimed is:

1. A polishing composition for a silicon wafer, comprising:
    a macromolecular compound including a constitutional unit (a1) represented by the following general formula (1), a constitutional unit (a2) represented by the following general formula (2), and a constitutional unit (a3) represented by the following general formula (3), wherein a total of the constitutional unit (a3) is 0.13 to 0.49 mol % of constitutional units of the macromolecular compound;
    an abrasive; and
    an aqueous medium

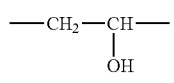

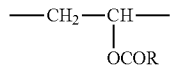

wherein R is a $C_1$ to $C_3$ alkyl group, and X is a constitutional unit that has a cation group in a molecule and is derived from an unsaturated compound copolymerizable with a vinyl alcohol lower fatty acid ester.

2. The polishing composition for a silicon wafer according to claim 1, wherein a total of the constitutional unit (a1), the constitutional unit (a2), and the constitutional unit (a3) is 50 to 100 mol % of the constitutional units of the macromolecular compound.

3. The polishing composition for a silicon wafer according to claim 1, wherein the constitutional unit (a3) is derived from a compound selected from a compound represented by the following general formula (3-1) and a compound represented by the following general formula (3-2)

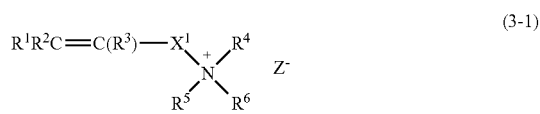

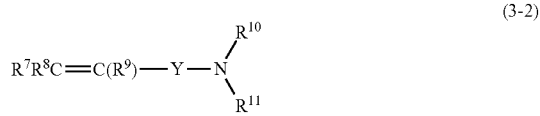

wherein $R^1$, $R^2$, $R^3$, $R^7$, $R^8$, and $R^9$ independently represent a hydrogen atom or a $C_1$ to $C_3$ alkyl group; $X^1$ and Y independently represent a group selected from a $C_1$ to $C_{12}$ alkylene group, $-COOR^{12}-$, $-CONHR^{12}-$, $-OCOR^{12}-$, and $-R^{13}-OCO-R^{12}-$, where $R^{12}$ and $R^{13}$ independently represent a $C_1$ to $C_5$ alkylene group; $R^4$ represents a hydrogen atom, a $C_1$ to $C_3$ alkyl group, a $C_1$ to $C_3$ hydroxyalkyl group, or $R^1R^2C=C(R^3)-X^1-$; $R^5$ represents a hydrogen atom, a $C_1$ to $C_3$ alkyl group, or a $C_1$ to $C_3$ hydroxyalkyl group; $R^6$ represents a hydrogen atom, a $C_1$ to $C_3$ alkyl group, a $C_1$ to $C_3$ hydroxyalkyl group, or a benzyl group; $Z^-$ represents an anion; $R^{10}$ represents a hydrogen atom, a $C_1$ to $C_3$ alkyl group, a $C_1$ to $C_3$ hydroxyalkyl group, or $R^7R^8C=C(R^9)-Y-$; and $R^{11}$ represents a hydrogen atom, a $C_1$ to $C_3$ alkyl group, or a $C_1$ to $C_3$ hydroxyalkyl group.

4. The polishing composition for a silicon wafer according to claim 1, further comprising at least one selected from polyvinylpyrrolidone, poly(N-acylalkyleneimine), and hydroxyethyl cellulose.

5. The polishing composition for a silicon wafer according to claim 1, further comprising a nonionic surfactant.

6. The polishing composition for a silicon wafer according to claim 1, wherein the abrasive has an average primary particle size of 5 to 50 nm.

7. The polishing composition for a silicon wafer according to claim 1, wherein the abrasive is colloidal silica.

8. A method for polishing a silicon wafer, comprising:
    polishing a silicon wafer with the polishing composition for a silicon wafer according to claim 1.

* * * * *